(12) United States Patent
Yoshizawa et al.

(10) Patent No.: US 6,299,791 B1
(45) Date of Patent: Oct. 9, 2001

(54) PIEZOELECTRIC CERAMIC MATERIAL AND PIEZOELECTRIC CERAMIC SINTERED BODY OBTAINED USING THE SAME

(75) Inventors: Isamu Yoshizawa, Omihachiman; Katsuhiro Horikawa, Shiga-ken, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/575,402

(22) Filed: May 22, 2000

(30) Foreign Application Priority Data

May 20, 1999 (JP) .................................................. 11-139780

(51) Int. Cl.$^7$ .................................................. H01L 41/18
(52) U.S. Cl. .................. 252/62.9 PZ; 501/134; 501/135; 501/136
(58) Field of Search .................. 252/62.9 PZ; 501/134, 501/135, 136

(56) References Cited

U.S. PATENT DOCUMENTS 3,484,377 * 12/1969 Tsubouchi et al. ............ 252/62.9 PZ

FOREIGN PATENT DOCUMENTS

5024916-A * 2/1993 (JP) .
5327397-A * 12/1993 (JP) .

* cited by examiner

Primary Examiner—C. Melissa Koslow
(74) Attorney, Agent, or Firm—Ostrolenk, Faber, Gerb & Soffen, LLP

(57) ABSTRACT

A piezoelectric ceramic material able to form a piezoelectric ceramic sintered body having such characteristics as a small electromechanical coupling coefficient, small resonant resistance and small temperature dependency of the resonant frequency that is required for designing a narrow-band filter is represented by principal component of the general formula of $(Pb_a Sr_b)(Zr_c Ti_d Mn_e Nb_f)O_3$ and having a composition satisfying the following relations of $0.93 \leq a \leq 1.01$, $0.01 \leq b \leq 0.04$, $0.37 \leq c \leq 0.47$, $0.48 \leq d \leq 0.58$, $0.0105 \leq e \leq 0.06$, $0.02 \leq f \leq 0.06$ and $1.05 \leq 2e/f \leq 2$, and comprising sub-components of about 0.003% to 0.1% by weight of each of $SiO_2$ and $Al_2O_3$ relative to the principal component.

10 Claims, 2 Drawing Sheets

PIEZOELECTRIC CERAMIC MATERIAL AND PIEZOELECTRIC CERAMIC SINTERED BODY OBTAINED USING THE SAME

BACKGROUND OF THE INVENTION

1. Field of the Invention

The present invention relates to a piezoelectric ceramic material and a piezoelectric ceramic sintered body obtained using the same. The present invention particularly relates to a piezoelectric ceramic material that can be advantageously used for piezoelectricity application devices that are required to have a relatively small electromechanical coupling coefficient and a small resonant resistance, and a piezoelectric ceramic sintered body obtained using the same.

2. Description of the Related Art $Pb[(Mn_{1/3}Nb_{2/3}), Zr, Ti]O_3$ based piezoelectric ceramic materials have been widely used for materials for constituting piezoelectric ceramic parts provided in piezoelectricity application devices including filters, oscillators and trap elements making use of bulk wave or surface wave because these materials have good resonance characteristics.

For example, Japanese Laid-open Patent Application No. 5-327397 discloses that a surface wave device having good resonance characteristics, temperature dependency of the resonance characteristics and heat resistance can be practically obtained by using a piezoelectric ceramic material represented by a general formula of $(Pb_{1-x}Me_x)\{(Mn_{1/3}Nb_{2/3})_aTi_bZr_c\}O_3$, wherein Me represents at least one of the element selected from Ca, Ba and Sr, and x, a and b satisfy the following relations:

$0.005 \leq x \leq 0.10$ $0.0 \leq a \leq 0.14$ $0.40 \leq b \leq 0.60$ $0.26 \leq c \leq 0.59$ and $a+b+c=1.00$ Japanese Laid-open Patent Application No. 5-24916 discloses $\{PbSr\}\{(TiZr)(MnNb)\}O_3$ based materials containing at least one of 0.005 to 0.040% by weight of $SiO_2$ and 0.005 to 0.040% by weight of $Al_2O_3$ in which irregularity of electric characteristics has been improved.

Narrow-band filters of conventional $Pb[(Mn_{1/3}Nb_{2/3}), Zr, Ti]O_3$ based piezoelectric ceramic materials that are required to have a small electromechanical coupling coefficient cannot be designed in a saturation polarization state because the materials have a large electromechanical coupling coefficient in that saturation polarization state. Another problem is that filter insertion loss is increased due to increased resonant resistance when the degree of polarization is made to be in a saturated state for decreasing the electromechanical coupling coefficient.

Narrow-band filters are desired to be superior to wide-band filters in temperature stability of resonant frequencies. It is not possible for the conventional $Pb[(Mn_{1/3}Nb_{2/3}), Zr, Ti]O_3$ based piezoelectric ceramic materials to exhibit such excellent temperature stability as required for the narrow-band filters.

SUMMARY OF THE INVENTION

Accordingly, the object of the present invention is to provide a piezoclectric ceramic material that can satisfy such characteristics as required for designing the narrow-band filters, and more practically, a piezoelectric material that can satisfy such characteristics as a small electromechanical coupling coefficient, a small resonant resistance and a small temperature dependency of the resonant frequency, and to provide a piezoelectric ceramic sintered body obtained by firing the piezoelectric ceramic material.

In one aspect, the present invention provides a piezoelectric ceramic material containing at least Pb, Sr, Zr, Ti, Mn, Nb, Si and Al, comprising a principal component represented by a general formula of $(Pb_aSr_b)(Zr_cTi_dMn_eNb_f)O_3$ and having a composition satisfying the following relations: $0.93 \leq a \leq 1.01$, $0.01 \leq b \leq 0.04$, $0.37 \leq c \leq 0.47$, $0.48 \leq d \leq 0.58$, $0.0105 \leq e \leq 0.06$, $0.02 \leq f \leq 0.06$; preferably $0.96 \leq a \leq 0.99$, $0.01 < b < 0.04$, $0.39 < c < 0.43$, $0.5 < d < 0.54$, $0.02 \leq e \leq 0.04$ and $0.02 < f < 0.06$; and $1.05 \leq 2e/f \leq 2$, wherein about 0.003% by weight or more and about 0.1% by weight or less, preferably about 0.02% to 0.1% by weight of $SiO_2$ and about 0.003% by weight or more and about 0.1% by weight or less, preferably about 0.02% to 0.1% by weight of $Al_2O_3$ as sub-components are contained relative to the principal component.

The piezoelectric ceramic material according to the present invention is preferably destined to be fired in an oxygen atmosphere. Accordingly, the present invention is also directed toward a piezoelectric ceramic sintered body obtained by firing the piezoelectric ceramic material in an oxygen atmosphere.

Preferably, the piezoelectric ceramic sintered body is used in an unsaturated polarization state having an electromechanical coupling coefficient of 80% or less of that in the saturated polarization state.

A piezoelectric ceramic sintered body having a small electromechanical coupling coefficient, a small resonant resistance and small temperature dependency of the resonant frequency can be obtained according to the present invention as hitherto described. A filter having a small insertion loss at narrow-bands and being excellent in temperature stability in a pass-band frequency is obtainable by using such piezoelectric ceramic sintered body for the filter.

The content of Pb (a) in the principal component is preferably within a range of $0.93 \leq a \leq 1.01$ because when a is smaller than 0.93, sintering property is decreased, failing obtaining a sufficiently dense sintered body, while the sintered body may be deformed when a is larger than 1.01.

The content of Sr (b) is preferably within a range of $0.01 \leq b \leq 0.04$ because when b is smaller than 0.01, electric characteristics turn out to be uneven in the sintered body due to decreased degree of polarization while when b is larger than 0.04, the electromechanical coupling coefficient is so extremely increased that the sintered body cannot be used for the piezoelectric ceramic materials for use in the narrow-band filters that are required to have a small electromechanical coupling coefficient.

When the content of Zr (c) and the content of Ti (d) are out of the ranges of $0.37 \leq c \leq 0.47$ and $0.48 \leq d \leq 0.58$, respectively, the temperature range where temperature dependency of the resonant frequency is small varies from the ambient temperature range of $-20°$ C. to $80°$ C. where the filter is usually used. Consequently, the content of Zr (c) and the content of Ti (d) preferably fall within the ranges of $0.37 \leq c \leq 0.47$ and $0.48 \leq d \leq 0.58$, respectively, in order to prepare a piezoelectric ceramic material for obtaining a highly practical piezoelectric ceramic sintered body having an excellent temperature stability at ambient temperatures.

The content of Mn (e) is preferably within a range of $0.0105 \leq e \leq 0.06$ because when e is smaller than 0.0105, the resonant resistance $Z_r$ is increased to enhance the filter insertion loss while, when e is larger than 0.06, the insulation resistance of the sintered body is decreased to make polarization treatment difficult.

The content of Nb (f) is preferably within a range of $0.02 \leq f \leq 0.06$ because when f is smaller than 0.02, abnormal grain growth occurs while when f is larger than 0.06, the sintering temperature is increased over 1250° C. to remarkably facilitate evaporation of PbO, causing deformation of the sintered body.

With respect to the relation between the content of Mn (e) and the content of Nb (f), the ratio of 2e/f was limited within a range of $1.05 \leq 2e/f \leq 2$ because, when the ratio of 2e/f is smaller than 1.05, temperature dependency of the resonant frequency is increased while insulation resistance is decreased to make polarization treatment impossible when the ratio of 2e/f is larger then 2.

Concerning $SiO_2$ and $Al_2O_3$ as sub-components, both of the content of $SiO_2$, and the content of $Al_2O_3$ are preferably to be about 0.003% or more and about 0.1% by weight or less because when the content of $SiO_2$ or $Al_2O_3$ is below the range as described above, mechanical strength of the sintered body becomes insufficient to give rise to damage in subsequent machining of the sintered body while, when the content is over the range described above, the sintering property is deteriorated to fail to obtain a dense sintered body, besides allowing the resonant resistance $Z_r$ to increase.

The piezoelectric ceramic sintered body according to the present invention is preferably used in an unsaturated polarization state having an electromechanical coupling coefficient of 80% or less of that in a saturated polarized state. The object is to allow a method for decreasing the degree of polarization available in order to attain a small electromechanical coupling coefficient required for the narrow-band filters. The piezoelectric ceramic sintered body according to the present invention is preferably obtained by firing in an oxygen atmosphere because the resonant frequency is not overly increased even when the degree of polarization is reduced to make the electromechanical coupling coefficient to be 80% or less of that in the saturation polarization state by firing the sintered body in an oxygen atmosphere, thereby suppressing insertion loss of the filter from being so largely increased.

DESCRIPTION OF THE PREFERRED EMBODIMENT

Example

Figure 1:
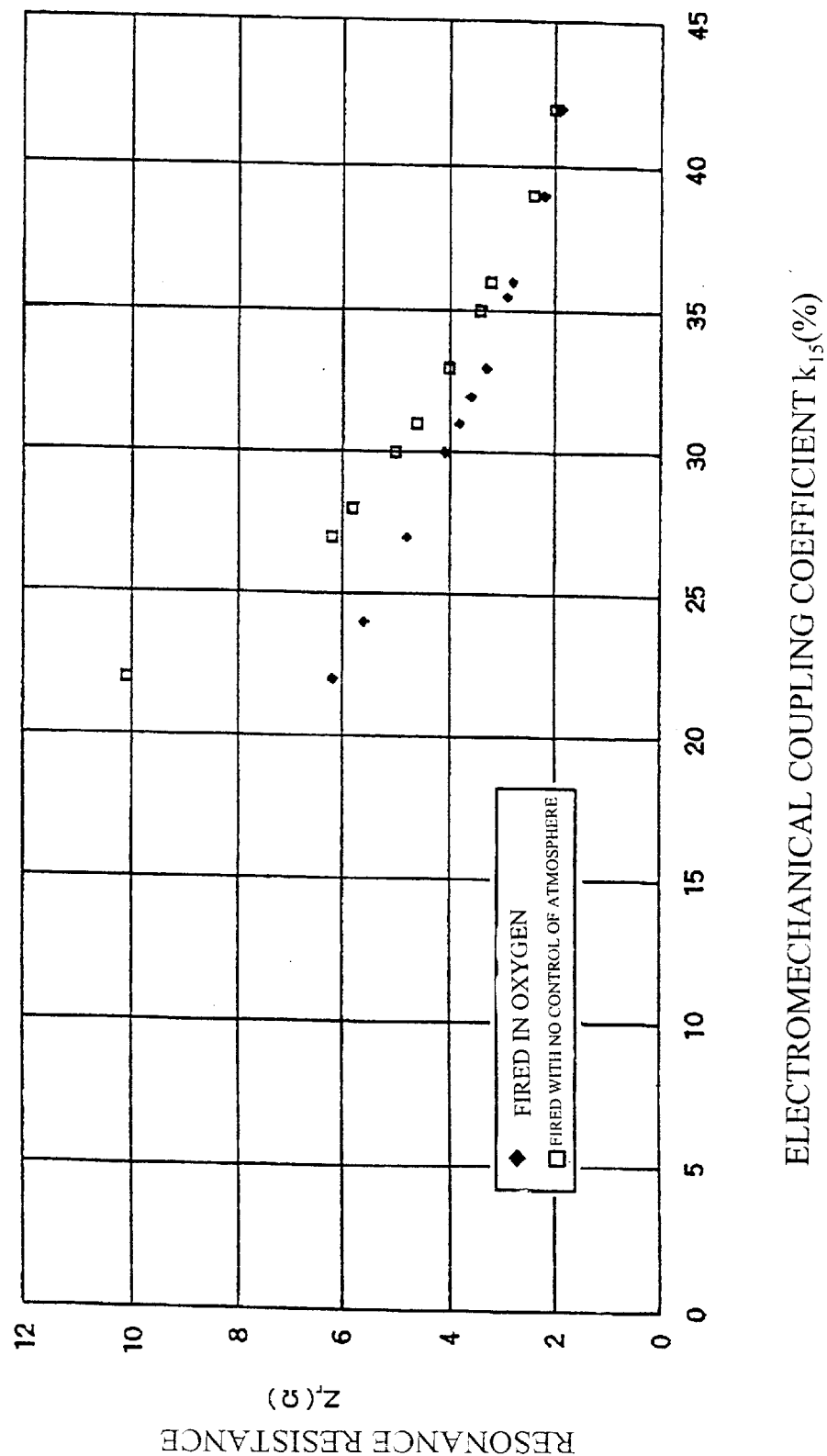
FIG. 1 is a graph showing the relation between the electromechanical coupling coefficient $k_{15}$ and the resonant resistance $Z_r$ when the degree of polarization is decreased with respect to the piezoelectric ceramic sintered body having the composition in the sample No. 3 prepared in the example according to the present invention.

As starting materials, $Pb_3O_4$, $SrCO_3$, $ZrO_2$, $TiO_2$, $MnCO_3$, Nb205, $Al_2O_3$ and $SiO_2$ were prepared.

These materials were weighed to be the compositions shown in TABLE 1 and, after wet-milling and mixing, the mixture was calcined at 800° C. to 1100° C. for 4 hours. The calcinated powder obtained was ground and granulated by adding an appropriate binder, followed by forming a rectangular parallelpiped molded body with a dimension of 20 mm×30 mm×8.5 mm by press molding.

TABLE 1

| Sample No. | a | b | c | d | e | f | $SiO_2$ wt % | $Al_2O_3$ wt % |
|---|---|---|---|---|---|---|---|---|
| 1* | 0.91 | 0.02 | 0.420 | 0.530 | 0.02000 | 0.0300 | 0.020 | 0.020 |
| 2 | 0.93 | 0.02 | 0.420 | 0.530 | 0.02000 | 0.0300 | 0.020 | 0.020 |
| 3 | 0.98 | 0.02 | 0.420 | 0.530 | 0.02000 | 0.0300 | 0.020 | 0.020 |
| 4 | 1.01 | 0.02 | 0.420 | 0.530 | 0.02000 | 0.0300 | 0.020 | 0.020 |
| 5* | 1.03 | 0.02 | 0.420 | 0.530 | 0.02000 | 0.0300 | 0.020 | 0.020 |
| 6* | 1.00 | 0.00 | 0.420 | 0.530 | 0.02000 | 0.0300 | 0.020 | 0.020 |
| 7 | 0.99 | 0.01 | 0.420 | 0.530 | 0.02000 | 0.0300 | 0.020 | 0.020 |
| 8 | 0.96 | 0.04 | 0.420 | 0.530 | 0.02000 | 0.0300 | 0.020 | 0.020 |
| 9* | 0.94 | 0.06 | 0.420 | 0.530 | 0.02000 | 0.0300 | 0.020 | 0.020 |
| 10* | 0.98 | 0.02 | 0.350 | 0.600 | 0.02000 | 0.0300 | 0.020 | 0.020 |
| 11 | 0.98 | 0.02 | 0.370 | 0.580 | 0.02000 | 0.0300 | 0.020 | 0.020 |
| 12 | 0.98 | 0.02 | 0.470 | 0.480 | 0.02000 | 0.0300 | 0.020 | 0.020 |
| 13* | 0.98 | 0.02 | 0.490 | 0.460 | 0.02000 | 0.0300 | 0.020 | 0.020 |
| 14* | 0.98 | 0.02 | 0.435 | 0.549 | 0.00500 | 0.0100 | 0.020 | 0.020 |
| 15* | 0.98 | 0.02 | 0.435 | 0.549 | 0.00525 | 0.0100 | 0.020 | 0.020 |
| 16* | 0.98 | 0.02 | 0.435 | 0.549 | 0.00670 | 0.0100 | 0.020 | 0.020 |
| 17* | 0.98 | 0.02 | 0.435 | 0.549 | 0.01000 | 0.0100 | 0.020 | 0.020 |
| 18* | 0.98 | 0.02 | 0.435 | 0.549 | 0.01033 | 0.0100 | 0.020 | 0.020 |
| 19* | 0.98 | 0.02 | 0.427 | 0.539 | 0.01000 | 0.0200 | 0.020 | 0.020 |
| 20 | 0.98 | 0.02 | 0.427 | 0.539 | 0.01050 | 0.0200 | 0.020 | 0.020 |
| 21 | 0.98 | 0.02 | 0.427 | 0.539 | 0.01333 | 0.0200 | 0.020 | 0.020 |
| 22 | 0.98 | 0.02 | 0.427 | 0.539 | 0.02000 | 0.0200 | 0.020 | 0.020 |
| 23* | 0.98 | 0.02 | 0.427 | 0.539 | 0.02067 | 0.0200 | 0.020 | 0.020 |
| 24* | 0.98 | 0.02 | 0.420 | 0.530 | 0.01500 | 0.0300 | 0.020 | 0.020 |
| 25 | 0.98 | 0.02 | 0.420 | 0.530 | 0.01575 | 0.0300 | 0.020 | 0.020 |
| 26 | 0.98 | 0.02 | 0.420 | 0.530 | 0.03000 | 0.0300 | 0.020 | 0.020 |
| 27* | 0.98 | 0.02 | 0.420 | 0.530 | 0.03100 | 0.0300 | 0.020 | 0.020 |
| 28* | 0.98 | 0.02 | 0.398 | 0.502 | 0.03000 | 0.0600 | 0.020 | 0.020 |
| 29 | 0.98 | 0.02 | 0.398 | 0.502 | 0.03150 | 0.0600 | 0.020 | 0.020 |
| 30 | 0.98 | 0.02 | 0.398 | 0.502 | 0.04000 | 0.0600 | 0.020 | 0.020 |
| 31 | 0.98 | 0.02 | 0.398 | 0.502 | 0.06000 | 0.0600 | 0.020 | 0.020 |
| 32* | 0.98 | 0.02 | 0.398 | 0.502 | 0.06200 | 0.0600 | 0.020 | 0.020 |
| 33* | 0.98 | 0.02 | 0.383 | 0.484 | 0.04000 | 0.0800 | 0.020 | 0.020 |
| 34* | 0.98 | 0.02 | 0.383 | 0.484 | 0.04200 | 0.0800 | 0.020 | 0.020 |
| 35* | 0.98 | 0.02 | 0.383 | 0.484 | 0.05333 | 0.0800 | 0.020 | 0.020 |
| 36* | 0.98 | 0.02 | 0.383 | 0.484 | 0.08000 | 0.0800 | 0.020 | 0.020 |
| 37* | 0.98 | 0.02 | 0.383 | 0.484 | 0.08267 | 0.0800 | 0.020 | 0.020 |
| 38* | 0.98 | 0.02 | 0.420 | 0.530 | 0.02000 | 0.0300 | 0.020 | 0.002 |
| 39 | 0.98 | 0.02 | 0.420 | 0.530 | 0.02000 | 0.0300 | 0.020 | 0.003 |
| 40 | 0.98 | 0.02 | 0.420 | 0.530 | 0.02000 | 0.0300 | 0.020 | 0.020 |
| 41 | 0.98 | 0.02 | 0.420 | 0.530 | 0.02000 | 0.0300 | 0.020 | 0.100 |
| 42* | 0.98 | 0.02 | 0.420 | 0.530 | 0.02000 | 0.0300 | 0.020 | 0.120 |
| 43* | 0.98 | 0.02 | 0.420 | 0.530 | 0.02000 | 0.0300 | 0.002 | 0.020 |
| 44 | 0.98 | 0.02 | 0.420 | 0.530 | 0.02000 | 0.0300 | 0.003 | 0.020 |
| 45 | 0.98 | 0.02 | 0.420 | 0.530 | 0.02000 | 0.0300 | 0.100 | 0.020 |
| 46* | 0.98 | 0.02 | 0.420 | 0.530 | 0.02000 | 0.0300 | 0.120 | 0.020 |

These molded bodies were then fired in an oxygen atmosphere at 1050° C. to 1250° C. for 1 to 5 hours to obtain sintered bodies. After lapping and grinding these sintered bodies, polarization electrodes were formed on the sintered bodies to subject them to a polarization treatment by impressing an electric field of 1 kV/mm to 3 kV/mm for 30 minutes to 60 minutes at 80° C. to 100° C. in a silicone oil bath.

Subsequently, rectangular plates (5.1 mm×1.7 mm×0.3 mm) were cut out of the sintered body along the direction coinciding with the longitudinal edge direction of the sintered body using a dicing saw after the polarization treatment. Piezoelectric characteristics obtained by applying a longitudinal vibration were evaluated with respect to each rectangular plate obtained as described above.

The electromechanical coupling coefficient $k_{15}$ (%) in the longitudinal vibration of the sample polarized at an electric field of 2 kV/mm, the resonant resistance $Z_r$ (Ω), the absolute value of the temperature coefficient $|f_r\text{-}TC|$(ppm/° C.) of the resonant frequency in the temperature range of -20° C. to 80° C. and the bend resistive strength (MPa) in the three point bending test are shown in TABLE 2. The samples marked with the symbol (*) correspond to those out of the range of the present invention.

TABLE 2

| Sample No. | $k_{15}$ (%) | $Z_r$ (Ω) | $|f_4 - TC|$ (ppm/° C.) | Bending Strength (MPa) | Remarks |
|---|---|---|---|---|---|
| 1* | *** | *** | *** | *** | Sintering is Insufficient |
| 2 | 28 | 4.0 | 28 | 120 | |
| 3 | 30 | 4.1 | 25 | 110 | |
| 4 | 31 | 3.9 | 27 | 105 | |
| 5* | *** | *** | *** | *** | Matching is Impossible |
| 6* | 27 | 4.0 | 25 | 110 | For Sample 6- Distribution of Resonance of Frequency is 3.3 times that of Sample No. 3 |
| 7 | 28 | 4.0 | 24 | 110 | |
| 8 | 31 | 3.7 | 26 | 104 | |
| 9* | 42 | 3.8 | 25 | 115 | |
| 10* | 24 | 4.2 | 41 | 119 | Matching is Impossible |
| 11 | 28 | 3.9 | 35 | 115 | |
| 12 | 32 | 3.6 | 36 | 110 | |
| 13* | 34 | 3.5 | 42 | 115 | |
| 14* | *** | *** | *** | *** | |
| 15* | *** | *** | *** | *** | |
| 16* | *** | *** | *** | *** | |
| 17* | *** | *** | *** | *** | |
| 18* | *** | *** | *** | *** | |
| 19* | 28 | 5.3 | 44 | 107 | |
| 20 | 27 | 4.9 | 34 | 112 | |
| 21 | 29 | 4.6 | 26 | 114 | |
| 22 | 29 | 4.2 | 23 | 110 | |
| 23* | *** | *** | *** | *** | Polarization is Impossible |
| 24* | 31 | 4.5 | 42 | 110 | |
| 25 | 31 | 4.2 | 32 | 105 | |
| 26 | 32 | 3.9 | 22 | 111 | |
| 27* | *** | *** | *** | *** | Polarization is Impossible |
| 28* | 33 | 3.9 | 41 | 115 | |
| 29 | 32 | 3.9 | 31 | 111 | |
| 30 | 32 | 3.5 | 24 | 114 | |
| 31 | 34 | 3.6 | 20 | 119 | |
| 32* | *** | *** | *** | *** | Polarization is Impossible |
| 33* | *** | *** | *** | *** | Matching is Impossible |
| 34* | *** | *** | *** | *** | |
| 35* | *** | *** | *** | *** | |
| 36* | *** | *** | *** | *** | |
| 37* | *** | *** | *** | *** | |
| 38* | 31 | 3.7 | 25 | 92 | |
| 39 | 31 | 3.8 | 25 | 105 | |
| 40 | 30 | 3.9 | 25 | 110 | |
| 41 | 30 | 4.5 | 25 | 115 | |
| 42* | 28 | 7.5 | 25 | 155 | |
| 43* | 32 | 3.8 | 25 | 90 | |
| 44 | 31 | 3.7 | 25 | 107 | |
| 45 | 29 | 4.8 | 25 | 122 | |
| 46* | 28 | 7.8 | 25 | 186 | |

The relations between the electromechanical coupling coefficient $K_{15}$ and the resonant resistance $Z_r$ when the degree of polarization was reduced in the sample No. 3 shown in TABLE 1 are plotted in FIG. 1 with respect to the cases when the firing atmosphere had not been controlled and when the molded body had been sintered in an oxygen atmosphere.

FIG. 1 clearly shows that the resonant resistance $Z_r$ at the degree of polarization for yielding the same electromechanical coupling coefficient is smaller when the molded body has been fired in an oxygen atmosphere than that when the firing atmosphere has not been controlled. Accordingly, a low loss material having a low resonant resistance can be obtained when the molded body is fired in an oxygen atmosphere for yielding a material having a low electromechanical coupling coefficient by controlling the degree of polarization.

With reference to TABLE 1 and TABLE 2, it can be seen that a desirable sintered body could not be obtained when the content of Pb (a) is reduced below the range of the present invention to 0.91 as is the case in the sample No. 1. On the contrary, machining of the sintered body was impossible when the content of Pb (a) is increased over the range of the present invention up to 1.03, because the sintered body was largely deformed. Accordingly, it is evident that the content of Pb (a) preferably fall within a range of $0.93 \leq a \leq 1.01$ in order to obtain a sufficiently dense sintered body within a practical deformation range.

All the samples with the content of Sr (b) of 0.01 or more, i.e., all samples except Nos. 6 and 7, have no practical problems since irregularity of the resonant frequency in the sintered body when the degree of polarization has been decreased falls within a range of 1.5 times of the irregularity in the sample No. 3 as a reference. However, it is not preferable that the content of Sr (b) is reduced to zero, since irregularity of the resonant frequency in the sintered body when the degree of polarization is reduced turns out to be 3.5 times of the irregularity in the sample No. 3, although the content falls within the range of the present invention. When the content (b) of Sr is increased over the range of the present invention up to 0.06, on the contrary, the material becomes to be inappropriate for the piezoelectric ceramic material for use in the narrow-band filter since the electromechanical coupling coefficient $K_{15}$ is increased over 40%. Consequently, the content of Sr (b) preferably be within a range of $0.01 \leq b \leq 0.04$.

When the content of Zr (c) or Ti (d) is out of the range of $0.37 \leq c \leq 0.47$ or $0.0.48 \leq d \leq 0.58$ as shown in the sample No. 10 or 13, the temperature range in which temperature dependency of the resonant frequency is small is out of the ambient temperature range of −20° C. to 80° C. where the filter is usually used. Therefore, the absolute value of $|f_r\text{-}TC|$ increases over 40 ppm, and thereby practical values of the ceramic sintered material for use in the narrow-band filter are compromised since the material is required to have a high accuracy with respect to the temperature dependency of the resonant frequency. Consequently, the contents c and d preferably fall within the ranges of $0.37 \leq c \leq 0.47$ and $0.48 \leq d \leq 0.58$, respectively.

The insertion loss increases over the acceptable level when the content of Mn (e) is smaller than 0.0105 as seen in the sample No. 19 since the resonant resistance $Z_r$ is increased over 5 Ω. When the content of Mn (e) exceeds 0.06 as seen in the sample No. 32, on the other hand, the sintered body cannot be utilized as a piezoelectric material since the insulation resistance of the sintered body decreases to make it difficult to apply a polarization treatment. It can be therefore concluded from the results hitherto described that the content of Mn (e) preferably be within a range of $0.0105 \leq e \leq 0.06$ for obtaining a piezoelectric ceramic sintered body in which polarization treatment is easily applied and which has a resonant resistance $Z_r$ within a practical range.

Coarse particles have frequently appeared due to abnormal grain growth when the content of Nb (f) is reduced below the range of the present invention to 0.01 as seen in Sample Nos. 14 to 18, generating remarkable defects on the machining faces in the succeeding machining process. Consequently, there are some problems in machinability for industrial applications. When the content of Nb (f) increases over 0.06 up to 0.08 as seen in the sample Nos. 33 to 37, on the other hand, the sintering temperature increases over 1250° C. to substantially facilitate evaporation of PbO thereby to induce deformation of the sintered body to make succeeding machining difficult. Accordingly, the content of Nb (f) preferably be within a range of $0.02 \leq f \leq 0.06$.

Figure 2:
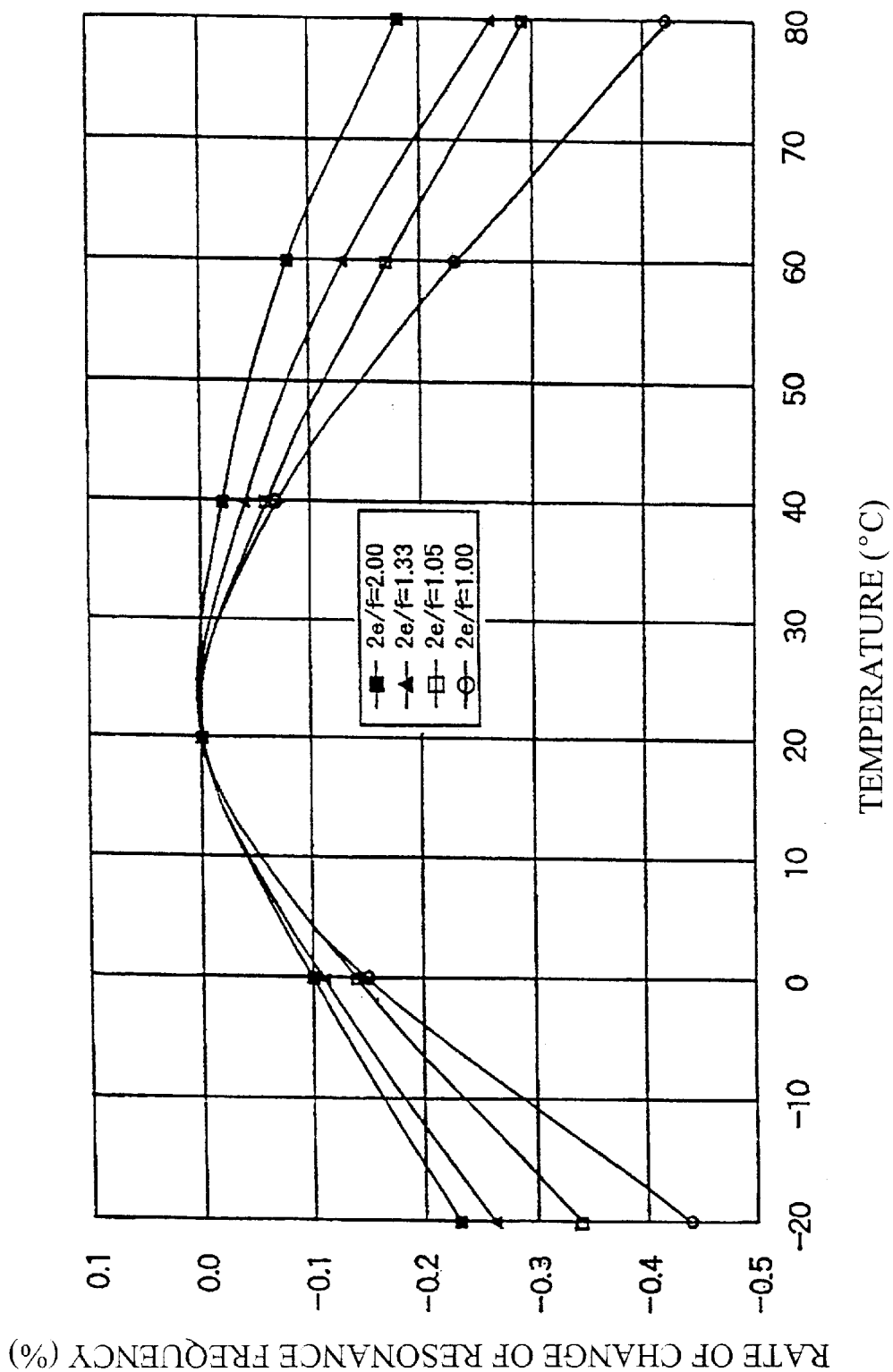
FIG. 2 is a graph showing temperature dependency of the resonant frequency when the ratio of 2e/f between the content of Mn (e) and the content of Nb (f) is changed with respect to the sample No. 2 prepared in the example according to the present invention.

FIG. 2 shows the rate of temperature change of resonance frequency when the ratio of 2e/f between the content of Mn (e) and the content of Nb (f) is changed.

As is evident from FIG. 2, the temperature dependency of the resonant frequency decreases as the ratio of 2e/f increases. It is not preferable for the narrow-band filter materials, which require highly accurate temperature dependency of the resonant frequency, that the ratio of 2e/f exceed one that is out of the range of the present invention as seen in the sample Nos. 19, 24 and 28, since the absolute vale of $|f_r\text{-TC}|$ increases over 40 ppm/° C. When the ratio of 2e/f is increased over the range of the present invention up to 2.1 as seen in the sample Nos. 23, 27 and 32, on the other hand, polarization treatment has been impossible due to decreased insulation resistance. Accordingly, the ratio of 2e/f is preferably within the range of $1.05 \leq 2e/f \leq 2$ in order to obtain a piezoelectric ceramic sintered body which is easy to polarize and has good temperature characteristics.

It is not preferable that the content of sub-component $SiO_2$ or $Al_2O_3$ is smaller than the range of the present invention as seen in the sample No. 38 or 43 because mechanical strength of the sintered body reduces to 100 MPa or below to cause damage in the succeeding machining process. When the content of $SiO_2$ or $Al_2O_3$ is larger than the range of the present invention, on the other hand, as seen in the sample No. 42 or 46, the sintering property turns out to be worse in addition to increasing the resonant resistance $Z_r$ over 5 Ω. Accordingly, both of the contents of $SiO_2$ and $Al_2O_3$ preferably fall within a range of about 0.003% to 0.1% by weight, respectively.

While the present invention has been described with reference to the specified examples, the piezoelectric ceramic material and the piezoelectric ceramic sintered body obtained using the same are not restricted to those described in the examples, but various modifications are possible within the scope of the present invention.

For example, the vibration mode of the piezoelectric element constructed using the piezoelectric ceramic sintered body according to the present invention is not necessarily limited to the longitudinal vibration, but can be also applied to any vibration modes including expansion vibration, vertical vibration and surface wave.

The piezoelectric ceramic sintered body according to the present invention can be also applied not only for the filters but also for all application fields of other piezoelectricity application devices such as trap elements and oscillators that are required to have small electromechanical coupling coefficients.

While specified oxides and carbonates such as $Pb_3O_4$ or $SrCO_3$ have been used for the starting materials of the piezoelectric ceramic materials in the foregoing examples, other oxides or other compounds that are finally converted into oxides may be used.

As hitherto described, a piezoelectric ceramic sintered body having a small electromechanical coupling coefficient, a small resonant resistance and small temperature dependency of the resonant frequency may be obtained by firing the piezoelectric ceramic material according to the present invention. Accordingly, piezoelectric elements such as filters that display small insertion loss at narrow band while being excellent in temperature stability of the resonant frequency can be obtained by using the piezoelectric ceramic sintered body.

Insertion loss of the filter can be reduced without making the resonant resistance so large even in an unsaturated polarization state having an electromechanical coupling coefficient of 80% of that in the saturation polarization state, when the piezoelectric ceramic sintered body is to be obtained by baking the piezoelectric ceramic material according to the present invention. Consequently, a narrow-band filter that is required to have a small electromechanical coupling coefficient can be advantageously obtained without decreasing the degree of polarization.

What is claimed is:

1. A piezoelectric ceramic material containing at least Pb, Sr, Zr, Ti, Mn, Nb, Si and Al, comprising a principal component represented by the general formula of $(Pb_aSr_b)(Zr_cTi_dMn_eNb_f)O_3$ wherein $0.93 \leq a \leq 1.01$ $0.01 \leq b \leq 0.04$ $0.37 \leq c \leq 0.47$ $0.48 \leq d \leq 0.58$ $0.0105 \leq e \leq 0.06$ $0.02 \leq f \leq 0.06$ and $1.05 \leq 2e/f \leq 2$ and wherein about 0.003% to 0.1% by weight of each of $SiO_2$ and $Al_2O_3$ are present relative to the weight of the principal component.

2. A piezoelectric ceramic material according to claim 1 wherein $0.96 \leq a \leq 0.99$ $0.01 \leq b \leq 0.04$ $0.39 \leq c \leq 0.43$ $0.5 \leq d \leq 0.54$ $0.02 \leq e \leq 0.04$ $0.02 \leq f \leq 0.06$ and wherein about 0.02% to 0.1% by weight of each of $SiO_2$ and $Al_2O_3$ are present relative to the weight of the principal component.

3. A body of sintered piezoelectric ceramic material according to claim 2.

4. A body of oxygen atmosphere sintered piezoelectric ceramic material according to claim 2.

5. A body of sintered piezoelectric ceramic material according to claim 1.

6. A body of oxygen atmosphere sintered piezoelectric ceramic material according to claim 1.

7. A piezoelectric ceramic sintered body according to claim 6 which in an unsaturated polarization state has an electromechanical coupling coefficient of 80% or less of that in the saturation polarization state.

8. A piezoelectric ceramic sintered body according to claim 5 which in an unsaturated polarization state has an electromechanical coupling coefficient of 80% or less of that in the saturation polarization state.

9. A piezoelectric ceramic sintered body according to claim 4 which in an unsaturated polarization state has an electromechanical coupling coefficient of 80% or less of that in the saturation polarization state.

10. A piezoclectric ceramic sintered body according to claim 3 which in an unsaturated polarization state has an electromechanical coupling coefficient of 80% or less of that in the saturation polarization state.

* * * * *